(12) United States Patent
Kluge

(10) Patent No.: US 12,078,704 B2
(45) Date of Patent: Sep. 3, 2024

(54) INTERLEAVED EXECUTION OF MRI MEASUREMENT SEQUENCES

(71) Applicant: Siemens Healthcare GmbH, Erlangen (DE)

(72) Inventor: Thomas Kluge, Hirschaid (DE)

(73) Assignee: Siemens Healthineers AG, Erlangen (DE)

( * ) Notice: Subject to any disclaimer, the term of this patent is extended or adjusted under 35 U.S.C. 154(b) by 0 days.

(21) Appl. No.: 17/198,306

(22) Filed: Mar. 11, 2021

(65) Prior Publication Data
US 2021/0286035 A1 Sep. 16, 2021

(30) Foreign Application Priority Data
Mar. 11, 2020 (EP) .................................. 20162408

(51) Int. Cl.
G01R 33/54 (2006.01)
(52) U.S. Cl.
CPC ......... *G01R 33/546* (2013.01); *G01R 33/543* (2013.01)
(58) Field of Classification Search
CPC ..... G01R 33/546; G01R 33/543; G01R 33/54
See application file for complete search history.

(56) References Cited

U.S. PATENT DOCUMENTS

| 5,714,884 | A | 2/1998 | Hoshino | |
|---|---|---|---|---|
| 8,299,789 | B2 | 10/2012 | Heid et al. | |
| 8,762,090 | B2 | 6/2014 | Kuehn | |
| 2008/0284431 | A1* | 11/2008 | Fishkin | G01R 33/561 |
| | | | | 324/307 |
| 2010/0090694 | A1* | 4/2010 | Heid | G01R 33/54 |
| | | | | 324/309 |
| 2016/0015326 | A1 | 1/2016 | Tanque et al. | |
| 2017/0176562 | A1* | 6/2017 | Li | G01R 33/543 |

FOREIGN PATENT DOCUMENTS

WO 2017174393 A1 10/2017

OTHER PUBLICATIONS

European Search Report dated May 25, 2020, Application No. 20162408.7.
Hennig, J., "Echoes—How to Generate, Recognize, Use or Avoid them in MR Imaging Sequences", in Concepts in Magnetic Resonance 3 (1991) pp. 125-143; 1991.

* cited by examiner

Primary Examiner — Rishi R Patel
(74) Attorney, Agent, or Firm — Banner & Witcoff Ltd.

(57) ABSTRACT

The disclosure relates to techniques for executing a measurement sequence in an MRI system, wherein a plurality of measurement subsequences are to be executed within the measurement sequence, each measurement subsequence comprising measurement blocks to be interleaved on a time scale of the MRI system. For each measurement subsequence a respective time value defines when the next measurement block is to be executed on a global time scale by the MRI system. The measurement subsequences are stored in a container ordered according to their respective time values, and the first measurement subsequence is accessed from the subsequence list for execution by the MRI system in run-time.

18 Claims, 7 Drawing Sheets

INTERLEAVED EXECUTION OF MRI MEASUREMENT SEQUENCES

CROSS-REFERENCE TO RELATED APPLICATIONS

The present application claims the benefit of the filing date of European patent application no. EP 20162408.7, filed on Mar. 11, 2020, the contents of which are incorporated herein by reference in their entirety.

TECHNICAL FIELD

The disclosure relates to techniques for executing a magnetic resonance (MR) measurement sequence. Various examples specifically relate to a method for interleaved executing of measurement subsequences in a magnetic resonance imaging (MRI) measurement sequence.

BACKGROUND

When executing a measurement sequence in an MRI system, concatenation and interleaving of measurement subsequences is a complex and difficult task.

According to conventional techniques, composite-like structures or nested loops are used for modelling a sequence of Sequence Building Blocks (SBB), or Sequence Kernels, wherein SBBs are selected and arranged for execution based on characteristics such as a slice/layer, k-space acquisition lines, or kernel patterns.

According to a conventional example, sequential execution of measurement subsequences may be performed using an outer loop through slices/layers, which may be regarded as independent measurements, and therein, one or more intermediate loops through measurement lines in k-space, and therein one or more inner loops through kernel patterns.

In another conventional example, interleaved execution of measurement subsequences may be performed using one or more outer loops through measurement lines in k-space, an intermediate loop through slices/layers, and one or more inner loops through kernel patterns.

However, this conventional approach is not efficient when it comes to complex subsequence combinations in a measurement sequence. High programming effort may be necessary to implement such interleaving patterns, wherein only certain types of predefined interleaving patterns may be possible, whereas other highly specific interleaving patterns, for example irregular or varying patterns, may not be easily realized.

SUMMARY

Therefore, a need exists for improved techniques for executing an MRI measurement sequence comprising a plurality of measurement subsequences that overcome or mitigate at least some of the mentioned limitations and disadvantages. This task is solved by the features of the claims and the embodiments of the present disclosure as discussed herein.

In the following, the solution according to the disclosure is described with regard to the claimed methods as well as with regard to the claimed measurement systems, wherein features, advantages, or alternative embodiments can be assigned to the other claimed objects, and vice versa. Accordingly, the embodiments for the measurement systems can be improved by features described or claimed in the context of the method embodiments. And in this regard, the functional features of the method embodiments can be performed by respective operative units of the measurement system embodiments.

A method for executing an MRI measurement sequence in an MRI system is provided, wherein a plurality of measurement subsequences are to be executed in the measurement sequence by the MRI system.

In other words, an MRI measurement sequence may include a plurality of measurement subsequences, which are to be executed within that measurement sequence, and which preferably are to be executed interleaved with each other. However, it is to be understood, that the techniques according to the present disclosure are not limited to interleaved execution of measurement subsequences, but may be applied to any execution of measurement subsequences in a measurement sequence, which may under circumstances lead to a sequential execution of subsequences.

Each of the measurement subsequences may comprise one or more measurement blocks, which have measurement instructions included therein to be executed by the MRI system. In other words, a measurement subsequence may include one or more measurement blocks, which are to be executed by the MRI system in a sequential order as defined by the measurement subsequence. Therein, a measurement block may comprise one or more control instructions, which are to be executed by the MRI measurement system, and which in detail describe the measurement parameters needed by the MRI system to execute the measurement block. In other words, measurement instructions may be structured into one or more measurement blocks.

In each measurement subsequence, a respective next measurement block may be defined, which is the measurement block in the respective measurement subsequence to be executed next by the MRI system. Accordingly, for each measurement subsequence, a time value may be determined, which defines when the next measurement block in the respective measurement subsequence is to be executed by the MRI system.

In other words, within a measurement subsequence, one measurement block of the one or more measurement blocks comprised in the measurement subsequence may be the measurement block that is to be executed next in the sequence of measurement blocks in the respective measurement subsequence. In an example, one or more measurement blocks of the measurement subsequence may have been executed already; further, one or more measurement blocks of the measurement sequence may still have to be executed next after the already executed measurement blocks, in an order as defined in the measurement subsequence. In this regard, a measurement subsequence may have a temporally sequential order of the measurement blocks defined, in which the measurement blocks have to be executed in the measurement subsequence. Accordingly, when executing a measurement subsequence, one measurement block may be defined as the sequentially next measurement block to be executed by the MRI system.

This is based on the finding that for any measurement subsequence comprising a plurality of measurement blocks, a measurement block may be identified and/or selected based only on a time characteristic, which may be an absolute point in time on a system time scale, defining when the measurement block is to be executed on an MRI measurement system time scale. Accordingly, based on a current point in time on a global MRI measurement system time scale, it may be uniquely identified, which is the next measurement block.

In various examples, for each of the measurement subsequences, which may be stored in a container, only one next measurement block may be identified, and the next measurement block may be associated with a respective absolute time value, which defines when the respective next measurement block is to be executed on a global time scale by the MRI system. This time value may be used in order to select and execute a specific subsequence from the plurality of subsequences, wherein further still to be executed measurement blocks of the measurement subsequence are not yet assigned to be executed in a time slice, and accordingly do not have an absolute time value associated, i.e. they are stored within the respective subsequence, but are not yet interleaved with each other, and/or scheduled in the measurement sequence by the MRI system to be executed. In such a way, within the subsequences in general, and specifically within the subsequences stored as individual elements in the container, the order of measurement-blocks of a single subsequence is well defined for each subsequence. In various examples, the subsequence provides a sequence of measurement blocks within the subsequence, i.e. the next to be executed measurement block, wherein the sequence and the next measurement block may for example be dynamically determined. In such a way, the order of measurement-blocks of different subsequences in the measurement sequences may be completely arbitrary, and not predefined. In particular, when executing a specific measurement block none of the following measurement blocks, which are following on the time scale in the measurement sequence may be defined and/or scheduled. The only assumption made is that the superblocks of individual subsequences will not overlap, i.e. use the same time slot.

Accordingly, modularity may be achieved not by selecting, parametrizing and executing SBBs/Kernels, i.e. superblocks, in a complex loop structure comprising a plurality of nested loops based on measurement block characteristics other than time, but by separating subsequences from subsequences. Each subsequence forms an independent, complete physical examination (e.g. physical test), while an SBB/kernel does not. In other words, a subsequence has a sequential order of measurement blocks defined within the respective subsequence. Specifically, the subsequence may provide only the next measurement block to be executed to the measurement sequence.

The disclosed techniques are based on the concept that for executing measurement subsequences, it may be sufficient that a subsequence is characterized and selected only based on a time characteristic, wherein for example only one measurement block in each measurement subsequence is associated with an absolute time value on the system time scale, in other words that each of the measurement subsequence may be characterized by a respective next measurement block associated with a respective time value. Based on only this time value, a measurement subsequence and/or a measurement block of the subsequence may be ordered/sorted, and or selected for execution in run-time, i.e. in runtime of the execution of the measurement sequence. Consequently, no pre-computation, i.e. predefinition, of interleaved sequence patterns before run-time is necessary.

In general, when deciding in a measurement sequence which measurement block of a plurality of measurement subsequences is to be executed at a given point in time, a time value may be used to identify and/or select a subsequence with a measurement block, e.g. only one time value of each subsequence.

In various examples, a time value may be an absolute time value, which is a point in time on a global time scale of the MRI system, and may be determined using a time value of the last executed measurement block in the respective measurement subsequence, specifically further using timing requirements between measurement blocks of a measurement subsequence as specified in the respective measurement subsequence, and more specifically further taking into account global restrictions/limitations of the MRI measurement system.

Timing requirements may describe a timing relationship between two measurement blocks in a measurement subsequence, e.g. between a recently executed measurement block and a following measurement block in the subsequence. In various examples, all measurement blocks within a subsequence are related by timing requirements. It is to be understood that measurement blocks of different measurement subsequences may not be related to each other by timing requirements, i.e. they may not be in temporal and/or sequential relationship, specifically, when the subsequences are stored in the container.

In various examples, when determining and associating a time value with a next measurement block of a measurement subsequence, the time values may be determined such that global technical restrictions of the MRI systems and/or the MRI measurement sequence are fulfilled, as will be explained in further detail.

Global restrictions/limitations of the MRI system/MRI measurement protocol may refer to one or more boundary conditions including:

Contrast specifications determining the contrast of the acquired magnetic resonance image, for example T1 contrast, T2 contrast, and fat suppression.

Image resolution specifications resulting from the desired resolution for a slice. For example, if multiple slices are acquired in the head near the cranium, the relevant surface per slice is always smaller with increasing proximity to the cranium until it ultimately contracts to a point. It is thus reasonable to take such image resolution specifications as they result from the anatomy (as an example) into account. Therefore, the necessary storage requirement and the gradient strength that is required in order to generate a corresponding resolution can be adapted, resulting in enormous programming effort using conventional techniques. According to various examples, the number of measurement blocks per subsequence varies from slice to slice, from subsequence to subsequence, thereby allowing easy implementation of interleaving of various types of subsequences.

Position specifications for at least one slice should be acquired in an image. Thus, where in the body this image is acquired (which is normally apparent solely from the diagnostic question) also plays a role.

Hardware limitations may arise from permissible load cycles for the gradient amplifier, for example, as well as for the edge steepness of the gradients, since specific limit values may not be exceeded or, respectively, a steep edge could lead to overload of the power amplifier.

Minimization of the measurement time may be an additional typical boundary condition that is desired in order to acquire images of the patient in as little time as possible. This in particular applies for examinations of the beating heart or what are known as breath-hold acquisitions, thus those acquisitions in which the patient holds his breath. Therefore, clear maximum values for the duration are predetermined for image acquisition that a measurement sequence should execute for this purpose.

Patient safety regulations resulting from the risk of peripheral nerve stimulation can be a result of steep gradients. Such a peripheral nerve stimulation is uncomfortable for the patient because it leads to involuntary movements of the patient. An unwanted movement of the patient can also significantly degrade the acquisition of an MR image since the acquired image is then blurry. Moreover, the RF power absorbed by the patient may not exceed specific limit values.

Some of the boundary conditions that are to be satisfied can be those that are already predetermined by the hardware or are monitored by the hardware itself by means of what are known as monitoring modules. In the actual progression of the measurement sequence, these monitoring modules ensure that limit values are not exceeded. If such a monitoring condition are violated in the progression of a measurement sequence, the entire measurement sequence is terminated.

The method according to the present disclosure comprises the following steps:

In a step, the measurement subsequences, which have a next measurement block defined to be executed, e.g. only the measurement sequences which have a next measurement block defined, are ordered and/or stored in a container. In various examples, such a container may be a software container or a hardware container (e.g. memory), or may be referred to as a storage structure, or list, or group, or as subsequence map, in which the measurement subsequences are stored and ordered as individual separate elements, including all their measurement blocks and/or loop structures, according to the time values of their respective to be executed next measurement blocks.

In various examples, the measurement subsequences may be stored in a sorted associative container, for example a std::map according to a C++ Standard Template Library (STL), in which the time values, e.g. only the time value of the next measurement block to be executed of each respective measurement subsequence, are used as the sorting key.

In other words, the measurement subsequences are ordered according to the time values of their respective next measurement blocks, wherein the first measurement subsequence in the order may be the measurement subsequence with the lowest time value. The lowest time value may refer to the following or next point in time relative to a current point in time and/or relative to a time value of the last executed measurement block.

It is to be understood, that in a more general way, the subsequences may also be stored unordered, however as separate elements in the container, wherein they can be selected and/or accessed and/or extracted from the container based on their respective time value, specifically only based on their respective time value. Here, storing the subsequences in a linear subsequence order makes it easier to identity the next measurement subsequence, i.e. it is simply the first subsequence in the subsequence order.

In various examples, a software container comprises as many individual elements as the number of measurement subsequences, wherein each measurement subsequence includes or consists of all its respective measurement blocks, such that each measurement subsequence in the subsequence map is characterized by a respective next measurement block of the respective measurement subsequence and/or a time value associated with the next measurement block.

For example, within the software container, the elements contained in the software container, i.e. the measurement subsequences, may be sorted or ordered in a subsequence order, which is defined by the time values of the respective next measurement blocks. A first measurement subsequence in the order may be the subsequence with the soonest time value associated to its next measurement step. In other words, each subsequence may be characterized by having only one next measurement block defined, and which is associated with only one time value.

In such a way, the measurement blocks are not treated as individual elements, but grouped in their respective subsequence without other measurement blocks of other subsequences, and instead the measurement subsequences may be treated as separate modules or elements, containing all their respective measurement blocks, wherein the measurement subsequences, including all their respective measurement blocks, are characterized and ordered according to their respective unique time values associated with their respective next measurement step.

In various embodiments, no other measurement blocks of a subsequence may be associated with a time value for execution, and/or no other functional criteria as in a composite or tree structure may be used to identify and select a measurement subsequence or measurement block. For instance, when stored, the measurement blocks of a subsequence may not be interleaved with the measurement blocks of another subsequence, or scheduled on a time axis of the measurement system for execution.

In general, the subsequence order may be defined only using a single measurement block per measurement subsequence, which is the next measurement block to be performed in the measurement subsequence, and specifically only by using the time values of the next measurement blocks of each measurement subsequence. For example, within a software container, measurement blocks of different measurement subsequences may not be mixed, or interleaved, with each other.

In another step, from the subsequence map, the first measurement subsequence in the subsequence order is accessed, or identified, or selected from the container.

Of this first measurement subsequence, only the next measurement block is executed, before the measurement subsequence is stored back in the subsequence map, so that another measurement block of an arbitrary subsequence may be executed next.

In other words, the current measurement block, i.e. the next measurement block of the first measurement subsequence, is executed, and then the next measurement block is determined, specifically the global start time value of the next measurement block is determined and is used as updated time value for the measurement subsequence, and as key for re-inserting and ordering the subsequence in the container.

While executing a measurement block of a measurement subsequence, the measurement subsequence may be extracted from the software container, i.e. may no longer be stored or included in the software container.

In particular, other following measurement blocks may not yet be scheduled in the measurement sequence, i.e. measurement parameters, gradients, positions on the time scale, and an in particular time slices may not be defined for following measurement blocks.

In another step, it may be determined if the extracted first measurement subsequence comprises a following measurement block, which is to be executed next in the extracted first measurement subsequence by the MRI system. For example, in the sequence of measurement blocks within the first measurement subsequence, there may be another measurement block in the first measurement subsequence to be executed after the recently executed next measurement block.

If it is determined that the extracted first measurement subsequence comprises a following measurement block, in another step a time value for execution of the following measurement block is determined.

The time value for the following measurement block may be determined based on the time value of the last executed measurement block in the extracted first measurement sequence. The time value may define when the following measurement block is to be executed on the time scale by the MRI system. This updated time value is then is used for reinserting the subsequence into the container.

Otherwise, if it is determined that the first measurement subsequence does not comprise a following measurement block, no next measurement block may be defined for the first measurement subsequence. Then, the first measurement subsequence does not have a next measurement block defined, and accordingly the subsequence then is not re-stored in the container.

The steps of the method may be repeated, while at least one measurement subsequence in the container has a next measurement block defined, in order to fully execute all subsequences, i.e. all measurement blocks of the measurement subsequences in the subsequence map. Then, the executed measurement sequence comprises all subsequences and all measurement blocks included therein in a sequential and temporal order as defined in the subsequences, however in an interleaving pattern, which is generated during execution and results from the reordering of the subsequences in the subsequence map.

In other words, the steps may be executed until only one measurement sequence is left in the container, then the one or more remaining measurement blocks of the last measurement sequence will be executed until no further measurement sequence is in the subsequence map.

In various examples, when a following measurement block is defined for an extracted measurement subsequence, the step of storing the measurement subsequences may comprise reinserting the extracted measurement subsequence back into the measurement sequence map, where the other not extracted subsequences are still stored. Within the subsequence map, the reinserted subsequence may be stored at a position in the subsequence order according to the time value of its next measurement block.

In a first or initial repetition of the steps of the method, each next measurement block may be associated with a respective predetermined initial time value. In other words, each subsequence may have a global start time, which defines when the first measurement block in the respective measurement subsequence is to be executed on the MRI system time scale. By defining respective initial time values for each of one or more measurement subsequence in the MRI measurement sequence, the interleaving pattern of subsequence in the MRI measurement sequence may be defined and/or optimized.

The measurement subsequences may be independent measurement subsequences, wherein the measurement subsequences may be executed by the MRI system independently from each other. In this regard, the measurement subsequences may also refer to independent physical examination (e.g. patient scans). In general, if a measurement block does not have a temporal relation to another measurement block it belongs to another subsequence. Typically, in an MR examination, all measurement blocks of a subsequence operate on the same volume and are in temporal relation to each other.

At least one, or all, of the measurement blocks may be indivisible, or uninterruptible, measurement blocks, wherein the measurement instructions within a measurement block are to be executed by the MRI system immediately after each other, in other words in immediate temporal succession, i.e. the measurement instructions cannot be separated from each other by another measurement instruction not included in the respective measurement block, or for example by a measurement block of another measurement subsequence. Such an uninterruptible measurement block may be referred to as a superblock.

By using measurement blocks which are uninterruptible, the measurement blocks become smaller and the interleaving pattern of a measurement sequence may become be more fine-grained and thus more efficient, which may lead to shorter measurement times.

Thereby, the method according to the present disclosure provides an improved method for executing a measurement sequence given a plurality of measurement subsequences, enabling faster programming of the measurement sequence and more complex interleaving patterns.

In particular, the proposed approach allows to describe all possible combinatorial interleaving patterns of a given set of arbitrary subsequences by defining the global start times of each subsequence, wherein it allows to run each possible interleaving pattern at once without any programming.

As a general rule, subsequences may be independent modules that can be executed on their own without any other subsequences around them. Arbitrary types of subsequences may be interleaved in an arbitrary order. A plurality of MRI applications that have conventionally been implemented with high programming efforts may be executed by this approach in real-time, i.e. on-the-fly, with little computation and programming effort, wherein an interleaving pattern is defined in run-time of the measurement sequence, e.g. only based on subsequences with time values. Examples of the measurement sequences include protocols such as Interleaved Slice, Sequential Slice, Slice Concatenation, Quick Saturation, Continuous Saturation, complex interleaving patterns of IR pulses with measurement kernels, which are in various examples FLAIR and/or STIR kernels, CAT scans, and similar protocols. It is to be understood that the techniques according to the disclosure are not limited to these MRI measurement sequences, but all possible combinatorial interleaving patterns of a given set of arbitrary subsequences may be realized.

An MRI system is configured to carry out a method for executing subsequences in an MRI measurement sequence.

The MRI system comprises an MRI control unit and a memory unit, wherein the memory unit stores control information executable by the MRI control unit, and wherein the MRI system is configured to perform the following steps when executing the control information in the MRI control unit.

A plurality of measurement subsequences are to be executed within a measurement sequence by the MRI system. Therein, the measurement subsequences comprise one or more measurement blocks with measurement instructions to be executed by the MRI system. For each measurement subsequence, initially a respective next measurement block is defined for each measurement subsequence, which is, for the respective measurement subsequence, the measurement block to be performed next in the MRI system. Each next measurement block is associated with a respective time value, which defines a point in time, when the next measurement block is to be executed on a time scale of the MRI system.

Therein, when executing the control information of the MRI control unit, the MRI system is adapted to perform the following steps.

In a step, the measurement subsequences, which have a next measurement block defined, are stored in a subsequence map ordered according to the time values of their next measurement blocks.

In another step, the first measurement subsequence in the subsequence map is identified and/or extracted from the subsequence map.

In another step, from the first measurement sequence, the next measurement block is executed by the MRI system.

The MRI measurement system may be further configured to perform any method, or any combination of the methods, according to the present disclosure.

A computing device is configured to perform the method for generating a measurement sequence, a sequence of measurement blocks, from a plurality of measurement subsequences according to the present disclosure. In various embodiments, such a computing device may comprise at least one processor, a memory, and an interface, the memory containing program code executable by said at least one processor, wherein execution of the program code causes the computing device to execute the steps of the method. The computing device may further be configured to perform the any combination of the methods according to the embodiments of the present disclosure for generating a measurement sequence.

A computer program, or computer program product, comprises instructions, to be executed by at least one processor, wherein executing the instructions causes the at least one processor to carry out one of the methods for generating a measurement sequence according to the embodiments of the present disclosure.

A computer-readable storage medium comprises instructions which, when executed by a computing device, cause the computing device to carry out one or more of the methods according to the embodiments of the present disclosure for generating a measurement sequence.

A computer program, or computer program product, is loadable onto a memory of an MRI controller of an MRI system, wherein when the computer program is executed by the controller of the MRI system, the computer program causes the MRI system to execute the steps of the method, or any combination of methods according to the embodiments of the present disclosure.

An electronically readable data carrier comprises electronically readable control information stored thereon, which is configured such that, when executed in an MRI controller of an MRI system, it causes the MRI system to execute the steps of the method, or any combination of methods according to the embodiments of the present disclosure.

For such MRI systems, computing devices, computer programs, and electronically readable data carriers, technical effects can be achieved which correspond to the technical effects described for the method embodiments according to the present disclosure.

Although specific features described in the above summary and the following detailed description are described in connection with specific examples, it is to be understood that the features may not only be used in the respective combinations, but may also be used isolated, and features from different examples may be combined with each other, and correlate to each other, unless specifically stated otherwise.

Therefore, the above summary is merely intended to give an overview over some features of some embodiments and implementations and is not to be construed as limiting. Other embodiments may comprise other features than the ones explained above.

BRIEF DESCRIPTION OF THE DRAWINGS/FIGURES

In the following, concepts in accordance with exemplary embodiments of the disclosure will be explained in more detail with reference to the following drawings, in which like reference numerals refer to like elements.

FIG. 1 schematically illustrates an MRI system with which techniques for executing a measurement sequence can be carried out, according to one or more embodiments of the disclosure.

FIG. 2 schematically illustrates a MRI measurement sequence including a subsequence, according to one or more embodiments of the disclosure.

FIG. 3 schematically illustrates two interleaved MRI measurement subsequences, according to one or more embodiments of the disclosure.

FIG. 4 schematically illustrates further two interleaved MRI measurement subsequences, according to one or more embodiments of the disclosure.

FIG. 5 schematically illustrates a flowchart with steps for executing MRI measurement subsequences, according to one or more embodiments of the disclosure.

DETAILED DESCRIPTION

Figure 1:
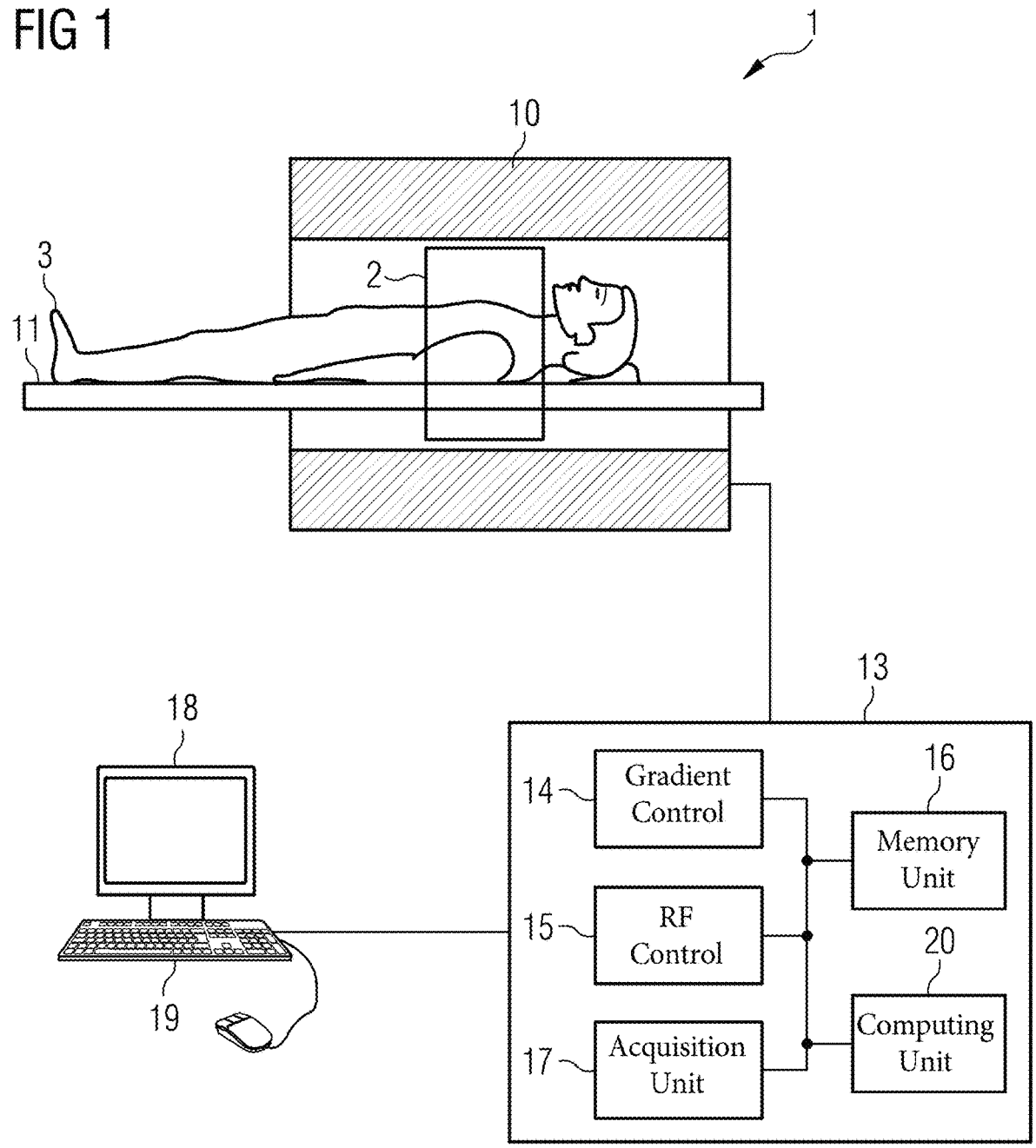

The above and other elements, features, steps, and concepts of the present disclosure will be more apparent from the following detailed description in accordance with exemplary embodiments of the disclosure, which will be explained with reference to the accompanying drawings.

It is to be understood that the following description of embodiments is not to be taken in a limiting sense. The scope of the disclosure is not intended to be limited by the embodiments described hereinafter or by the drawings, which are taken to be illustrative only. The features of the various examples may be combined with each other, unless specifically noted otherwise.

The drawings are to be regarded as being schematic representations, and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

In the following, various techniques with respect to generating and/or executing an MRI measurement sequence based on a plurality of measurement subsequences will be explained. An improved method for execution of a measurement sequence, which enables efficient interleaving of subsequences will be provided.

A method for executing a measurement sequence in an MRI system is provided, wherein a plurality of measurement subsequences are to be executed within the measurement sequence, each measurement subsequence comprising measurement blocks to be interleaved on a time scale of the MRI system. For each measurement subsequence a respective time value defines when the next measurement block is to be executed on a global time scale by the MRI system. The measurement subsequences are stored in a container ordered according to their respective time values, and the first measurement subsequence is extracted from the subsequence list for execution by the MRI system in run-time.

Magnetic resonance (MR) scanners or systems (also called nuclear magnetic resonance tomographs) today are a basic component of the clinical routine for examination of patients in hospitals. Moreover, magnetic resonance scanners can also be used for the examination of animals and/or biological samples.

Measurement sequences are necessary to control a MR system. The generation of MR images in an MR scanner requires an exact, temporal workflow between the radio-frequency excitation of the spins, the spatial coding, and the detection of the resonant response of the spin. The temporal workflow of the excitation, preparation, and detection is called a pulse sequence or measurement sequence. A measurement sequence or subsequence may comprise one or more measurement blocks comprising control instructions to be executed by the MR scanner. In this regard, when a number of measurement sequences are to be executed by a measurement system, they may be referred to as measurement subsequences and may be executed in, or combined to form, a single measurement sequence.

A measurement sequence or subsequence may further be divided into segments. A single segment of a measurement sequence or subsequence can be classified according to its purpose. This division is designated as a measurement block. A measurement block is thus an established time segment within the measurement sequence or subsequence that serves a specific purpose, for example the excitation of the nuclear spins. Measurement blocks contain control instructions, i.e. measurement instructions, for the MR scanner. The measurement blocks may correspond to time slices on a system time scale, which precisely establish what the MR scanner has to do and at which point in time. A series of time slices can be executed in the MR scanner because they contain all instructions and their temporal correlation to control the MR scanner. Alternatively, the execution of the time slices with a control unit connected with the MR scanner is also possible.

When measurement blocks in a measurement sequence are executed as a series of time slices in the MR scanner, the time slices are joined seamlessly (i.e. without gaps). Each of the time slices has a specific length. Each of the time slices may be associated with a type from the set: transmission type for transmission of RF power; reception type to detect the resonant response of the nuclear spins; and warp type to prepare the nuclear spins. Time slices of the transmission type are used as excitation pulses to excite the nuclear spins, to refocus the nuclear spins, and in a hybrid form that serves both for excitation and for refocusing. In addition to these, there are time slices in which RF energy is emitted and/or an RF signal is received. Moreover, RF pulses are known for the inversion of the nuclear magnetization, called inversion pulses. This time slice based programming paradigm is an exemplary way of defining measurement blocks. Any other suitable paradigm may be used in accordance with the embodiments described herein. As long as the time measurement points for connecting the measurement block together to a subsequence is provided.

For example, a measurement sequence for execution in an MR scanner in a clinical everyday situation may be composed of 106 different time slices that are rolled out in a sensitive temporal correlation among one another. The creation of the measurement sequences comprising a plurality of subsequences with different measurement purposes has developed into its own field of MR physics.

Conventionally, measurement sequences for execution in an MR scanner are prepared by a sequence programmer. This is performed in one of the known programming languages, normally C++, which describes all properties and the temporal sequence of the measurement blocks. Extensive (for example temporal) connections exist between individual measurement blocks so that an MR image can be acquired. If these connections are not maintained, the desired MR image may not be acquired, or be acquired with low quality results. The checking of these extensive connections by the sequence programmer is a time-consuming and error-prone process. Moreover, when performing an interleaved execution of subsequences in an MRI system, concatenation and interleaving of measurement blocks, in particular of non-interruptible parts of sequence timing, is a complex and difficult task.

Existing techniques as described for example in U.S. Pat. No. 8,762,090, use a composite-like structure or nested loops for modelling a sequence of SBBs (Sequence Building Blocks or Sequence Kernels), wherein SBBs are selected for execution according to structural characteristics, such as being associated with a certain slice/layer, measurement line in k-space, or a kernel pattern.

In a common example, a sequential slice measurement sequence may comprise an outer loop through slices/layers, which may be regarded as independent measurements, therein, one or more intermediate loops through measurement lines in k-space, and one or more inner loops through kernel patterns.

In another common example, an interleaved slice measurement sequence may comprise one or more outer loops through measurement lines in k-space, an intermediate loop through slices/layers, and one or more inner loops through kernel patterns. Therein, switching from interleaved to sequential execution requires high reprogramming or reconfiguring effort of the composite loop, as given n loops in the composite structure, then there may be n! (n factorial) different configurations of the looping software.

In various examples, among the given subsequences to be executed in the measurement sequence, there are two or more identical subsequences. Nested loop/composite implementations struggle with executing identical subsequences, while with this concept any type of subsequence can be interleaved. The design of those patterns is to be solved mathematically, wherein the execution may be effortlessly realized with the techniques according to the present disclosure.

However, this approach is not efficient when it comes to complex interleaving patterns or understanding the "sequence nature" and timing of an MR sequence. For example, only certain types of interleaving of blocks of different subsequences may be possible, wherein other complex interleaving patterns, such as irregular or varying patterns with regard to the structural features, are difficult or not achievable. As a result, extreme complex software modules have to be used, which are limited by forcing a linear sequence execution into a tree-like or composite structure.

The present disclosure may be used for a technical implementation for interleaving superblocks of subsequences as described in U.S. Pat. No. 8,299,789 B2, wherein the definitions and interrelations of measurement sequences, measurement subsequences, measurement blocks, W/X/P/WX blocks, and time slices, together with the relevant parameters and indices for describing a measurement sequence/subsequence, are incorporated by reference into the present disclosure. In this regard, for the incorporation of such features from U.S. Pat. No. 8,299,789 B2, protection may be sought for such features, wherein such features may contribute to the definition of features solving the technical problem underlying the embodiments of the disclosure.

A measurement sequence may include many different individual MR measurements, for example the simultaneous acquisition of data from multiple slices. The acquisition of a single slice could be formulated as a single module, for example. Multiple instances of the individual module are then necessary for acquisition of multiple slices and are interleaved for simultaneous execution of the instances so that they can be executed without overlap. Such a module within the measurement sequence is designated as a subsequence. A subsequence may refer to a reasonable subset of WX blocks within a measurement sequence. A measurement sequence therefore is composed of at least one subsequence. The possibility to consider subsequences within a measurement sequence in isolation is also reasonable.

In other words, a measurement sequence may be structured into, i.e. comprise, a plurality of measurement subsequences. A measurement subsequence may be structured into, i.e. comprise, a sequence of measurement blocks, each of which comprise a sequence of measurement instructions to be executed by the MRI measurement system. In various examples, a measurement block may refer to one or more of, or a combination of, W and X and WX blocks, a combination may be a non-interruptible measurement block, or indivisible combination of such W/X/WX blocks, which are executed uninterrupted, in other words a superblock.

Structuring the measurement instructions of a measurement subsequence into measurement blocks makes it possible to arrange and execute the instructions more precisely and efficiently, and possibly interleave with measurement blocks of another measurement subsequence on a time line in an MRI system.

A measurement subsequence may operate on a certain physical measurement volume in the MRI system, and/or may perform an independent physical examination on a physical measurement volume independent from other subsequences to be performed in the same measurement sequence and, as such, may be considered an independent software module.

In a measurement sequence or subsequence, measurement blocks may correspond to one or more time slices on a time scale of the MRI system, and may join seamlessly and without overlap. Relative time correlations between individual blocks may be defined in a measurement subsequence. For example, a measurement block may be a warp (W) block or an X block, or a combination thereof into one unit, which is known as a WX block, which allows concise and elegant measurement sequence specifications. A measurement block may typically refer to any combination of X, W, or WX blocks, which may thereby be selected and executed as a unit, i.e. the measurement block.

Therein, a warp block serves for preparation of the nuclear magnetic resonance system. A pause or a pause block is a time segment during a measurement sequence in which no action is executed; essentially, the MR scanner waits. In contrast to this, an X block is representative of a time slice during which RF power is emitted and/or an RF signal is received. X blocks of the transmission type can represent an excitation pulse, a refocusing pulse, an inversion pulse or a hybrid made up of excitation and refocusing pulses. An excitation pulse is an RF pulse that excites the spin system. A refocusing pulse reestablishes the coherence of the nuclear spins. Inversion pulses are used to invert the nuclear magnetization. Moreover, there are also X blocks of the transmission type that represent a hybrid of excitation and refocusing pulses. Transmission pulses of the hybrid form are of particular interest in connection with stimulated echoes. Transmission pulses of the hybrid type serve to fold the non-transversal magnetization back into the transversal plane so that it can be detected as a signal. A more detailed explanation is available in Hennig, J., "Echoes—How to Generate, Recognize, Use or Avoid them in MR—Imaging Sequences" in Concepts in Magnetic Resonance 3 (1991), 125-143. It is to be understood, that measurement sequence models in which other measurement blocks than X, W, and WX blocks are also comprised would be conceivable.

Within a measurement subsequence, relative timing requirements for the measurement blocks may be defined, for example precise periods of time between specific measurement blocks, and/or minimum and/or maximum periods of time between specific measurement blocks, and/or a seamless joining of specific measurement blocks with one another without overlapping. Based on these timing requirements, and based on a point in time when a last measurement block of a measurement subsequence was executed by the MRI system, a point in time, e.g. an absolute time value, may be determined for a next measurement block of the measurement subsequence to be executed, which describes when, on an MRI system time scale, the next measurement block is to be performed for the measurement subsequence by the MRI system. The time value may, for example, refer to a start time, or end time, or a time point of the center of the respective measurement block; however it is only required to unambiguously define a period of time in which the measurement block is to be performed on the system time scale.

In an additional embodiment of the method according to the disclosure, indices regarding each of the measurement blocks are determined that are defined from the run through the measurement subsequence. Strictly speaking, it is one index for each measurement block. As used herein, "indices" means a running index across all measurement blocks via which it may be possible to uniquely identify each of the measurement blocks within the measurement subsequence. In other words, the index can be understood as a reference (or an identification number) of the measurement block. A next measurement block may be determined using these indices.

The techniques according to the embodiments of the present disclosure may be used to automatically execute a measurement sequence comprising a plurality of measurement subsequences, wherein the temporal sequence, in other words the order or sequence of measurement blocks on an absolute time scale of the measurement system, is automatically determined in run-time. Thereby, an interleaving pattern is created at run-time of the measurement sequence, wherein an interleaving pattern is not predetermined but results from selecting and executing measurement subsequences based on a time value, i.e. the earliest, next measurement block is selected. In other words, the computer-implemented techniques provide automatic generation and execution of measurement subsequences, wherein as an input, only the subsequences and respective start times of the subsequences are needed.

Therein, a resulting interleaving pattern may change and thus even be irregular with respect to other structural characteristics of the measurement blocks, such as slice/layer, k-space lines, and kernel pattern.

Subsequences may contain indivisible superblocks. The smallest indivisible superblock within a measurement sequence is a WX block. The WX block may not be interrupted since otherwise the coherence of the nuclear spins is distorted and a defined RF signal is no longer generated. In addition to the WX block, there are larger indivisible superblocks that likewise may not be interrupted or divided. Indivisible superblocks within a subsequence are characterized in that they are connected by a pause in the corresponding directed graph, wherein the subsequence comprises a single superblock in the event that a subsequence does not comprise any pauses.

Principles of interleaved execution of measurement subsequences will be described shortly in the following.

According to known techniques, a measurement sequence is described by the incorporation of what is known as a "sequence kernel" into a loop structure in which the sequence core is executed repeatedly. The sequence core implements the basic scan techniques, for instance gradient echo (GE), turbo-spin echo (TSE), true FISP (TRUFI), echo planar imaging (EPI) etc. The loop structure repeatedly invokes the sequence core in a fully defined manner for all raw data lines in order to generate from these all MR images which should be measured by the measurement sequence. A "protocol" is the measurement sequence together with a set of specific parameters for the measurement sequence, for instance the field of view (FOV), the resolution, the echo time, etc. An examination normally is composed of a number of such protocols that are executed in series.

A sequence can likewise represent a complete examination of a patient. A measurement sequence thus moves between these two extremes. In order to register the structure of a measurement sequence, it is recommended to subdivide the entire stream of WX blocks WX into modules or subsequences.

The entire stream of WX blocks WX typically consists of many different MR measurements, for example the acquisition of multiple slices that are acquired simultaneously. The acquisition of a single slice could be described independently, for example, and be viewed as an independent module. Multiple instances of this module that are executed in an interleaved manner so that the timing of the different modules does not overlap would then be necessary for examination, i.e. for the acquisition of multiple slices. Such a module can be designated as a "reasonable sub-set of WX blocks" or as a subsequence.

Within a subsequence, regions may be provided, for which it is explicitly allowed that other subsequences implement tasks in the hardware of the MR scanner without interfering with the measurement. The reasons for this are the interleaving of slices in multi-slice measurements and the inversion measurement of individual slices that today allow that something is executed even between the inversion pulse and the excitation pulse. Such a region within a subsequence is designated as a pause P. Because an X block X and its associated warp block W are executed as a unit, such a pause P can occur only after an X block X and before a warp block W. The pauses P sub-divide the subsequence into indivisible superblocks that may not be interrupted; however the interleaving also works for subsequences not using the described state machine with superblocks made of WX, i.e. an arbitrary and/or also a divisible measurement block, which may in various examples be a composition of superblocks.

A subsequence may comprise a start time that specifies where on the global time axis t the first measurement block of the subsequence is performed; this may be referred to as initial time value in a first repetition of the steps of the method.

As an illustrative example, multiple measurement subsequences are provided to be executed as, i.e. within a single, to be defined, measurement sequence. At least one subsequence comprises pauses. Further subsequences are then determined from the other measurement sequences. For interleaved execution of the measurement subsequences, at least one of the further subsequences is executed without overlap during the pauses of the respective first measurement subsequence. In other words, it should thus be ensured that the subsequence inserted into the pauses of the first measurement subsequence are always situated with their indivisible superblocks, or in general measurement blocks, in the pauses of the first measurement subsequence. Pauses between the indivisible superblocks are the time window during which the execution of additional subsequences is possible.

Accordingly, the concept of the independent measurement subsequences allows the construction of measurement sequences using instances of arbitrary subsequences. Every instance of a subsequence may have a pattern, i.e. a characteristic on the global time axis t. In order to achieve short measurement times or to achieve a special physical effect (for example the regional saturation of the fat signal), instances of subsequences should be interleaved on the time axis t, i.e. measurement blocks of different subsequences are not performed immediately after each other, but measurement blocks of different subsequences may be e.g. alternating on the time scale.

Due to long-term hardware and patient limitations, for example the switching cycles RF of power amplifiers as well as tissue-specific absorption rates (sensor arrangement), the length of any one warp block W and/or X block X depends primarily on what has happened before a warp block W on the global time axis t. In other words, long-term limitations describe limitations, or restrictions of the MR system, that must be complied with over the entire course of the measurement sequence.

The time axis characteristic of a measurement sequence depends on the interleaving of the subsequences. In order to thus correctly describe and calculate the sequence timing, it is necessary to consider the timing problem of the subsequence and the problem of the subsequence interleaving together. It is possible to specify a complete problem description, at least insofar as the number of subsequences is known in addition to the number of measurement blocks for each of the subsequence. Unfortunately, this problem is generally not easily solvable with commonly available computing resources. What makes this problem more difficult is the fact that the determined time values for the individual measurement blocks must be fitted to the time schedule of a magnetic resonance scanner. Insofar as this requirement is already formulated as a boundary condition for the solving of the one problem, a numerical solution to timing problem becomes nearly impossible.

FIG. 1 schematically illustrates an MRI system with which the methods for executing a measurement sequence can be carried out, according to embodiments of the disclosure.

An examination person, or more generally an examination object 3, is positioned in the tunnel of MR system 1 with an examination volume 2 of the MR system 1. The MR system 1 has a magnet 10 for generating a basic magnetic field BO, whereby the examination person 3 is arranged on a table 11 and is moved into the center of the magnet to acquire location-coded magnetic resonance signals from examination volume 2. By irradiating high-frequency pulse sequences and switching magnetic field gradients, the magnetization produced by the base field BO can be disturbed by deflection of the nuclear spins from their equilibrium position, and the currents induced in receiving coils when returning to their equilibrium position can be converted into magnetic resonance signals. The general functionality for the acquisition of MR images and MR projections and the detection of magnetic resonance signals are known to the person skilled in the art, so that a further detailed explanation is omitted.

The MR system 1 also has a MR control unit 13, which is used to control the MR system. The central MR control unit, control computer, control system, or control circuitry 13, which is designed such that the method described below for device localization is carried out, has a gradient control or gradient control circuitry 14 for controlling and switching the magnetic field gradients and an RF control or RF control circuitry 15 for controlling and irradiating the RF pulses for deflecting the nuclear spin from its equilibrium position. In a memory unit 16, for example, the parameters necessary for the acquisition of MR images and MR projections can be stored, as well as all computer programs required for the operation of MR system 1. An acquisition unit or acquisition circuitry 17 controls the image acquisition and thus controls the sequence of the magnetic field gradients and HF pulses as well as the reception intervals of MR signals depending on the selected parameters. Thus, the acquisition unit 17 also controls the gradient control 14 and the RF control 15.

MR images or datasets can be generated in a computing unit 20, and can be displayed on a display 18, on which for example images displaying the examination object 4 are depicted to a person performing a medical examination. Similarly, the depicted measurement system may be used to perform i.e. spectral MR measurements. An operator can operate MR system 1 via an input unit 19. The memory unit 16 can include MR measurement subsequences and computer programs which, when executed in the computing unit 20 shown, are executed using one or more embodiments according to the present disclosure. The MR control unit 13 may also be designed to improve a technique for executing interleaved measurement sequences as explained in detail herein. In particular, the memory unit stores 16 control information that can be executed by the MR control unit 13. Furthermore, the acquisition unit 17 is designed in such a way that it can perform the measurement sequences as described below.

Figure 2:
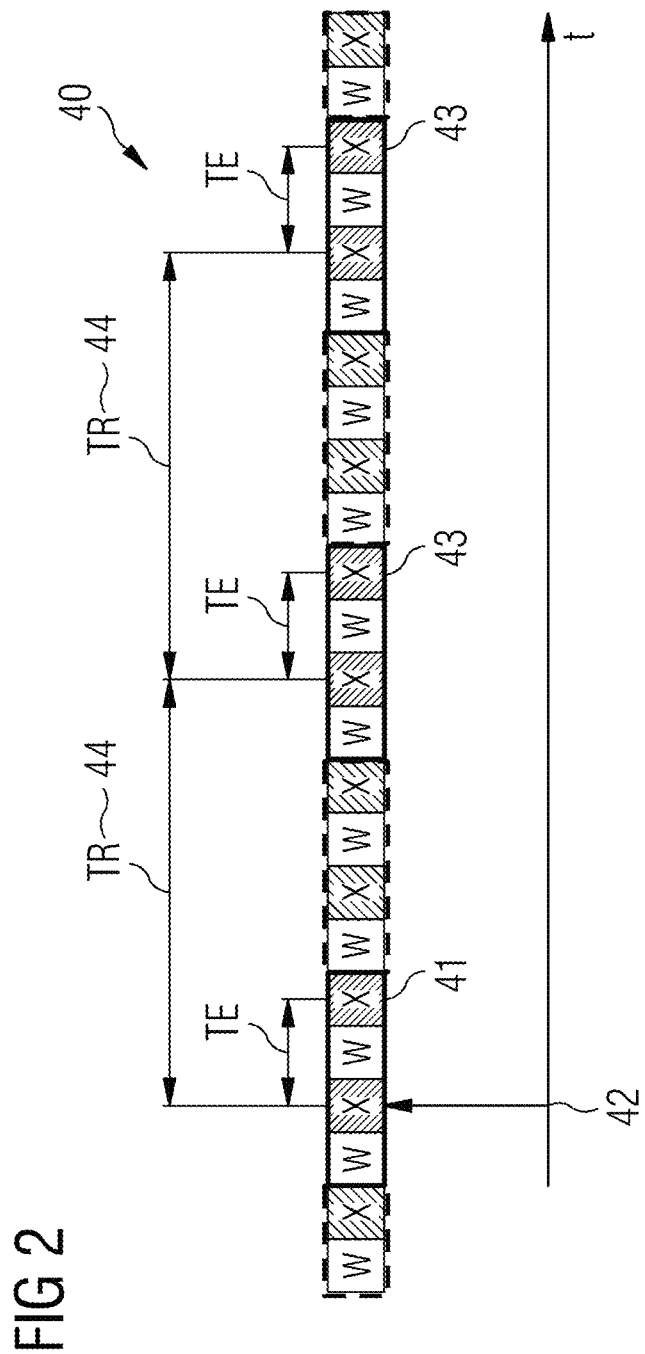

FIG. 2 schematically illustrates a measurement sequence comprising a stream of W blocks and X blocks, wherein some of the blocks 41, 43 are comprised in measurement blocks of a subsequence 40.

In general, to execute an X block it may be necessary to impress a phase on the spin (and in fact in a predetermined manner) and also to specify an established start amplitude for the gradients. This is not possible after execution of the X block. The task of the warp block W may be to imprint a specific phase onto the nuclear spins and to achieve a specific gradient value at its end. Therefore, it may be useful to associate every X block X with precisely one warp block W that precedes it. This is based on the fact that at least one warp block W is needed to manipulate the phase of the nuclear spins and to switch the gradient amplitudes between two X blocks.

Referring back to FIG. 2, subsequence 40 has a next measurement block 41 defined, which is a measurement block to be executed next in the sequence of measurement blocks of the subsequence 40, and following measurement blocks 43, all of which are embedded into the stream of WX blocks of the measurement sequence.

Next, measurement block 41 is associated with a time value 42 on time scale t, indicating when, on the time scale, the measurement block 41 is to be executed.

The subsequence timing requirements TR 44, via which the measurement blocks 41, 43 of the subsequence 40 are connected with one another are likewise shown. Here, the time value corresponds to a center of a first X block within the next measurement block 41, whereby the time slices, i.e. measurement time period, of the complete next measurement block 41 are determined.

The time value 42 of the next measurement block 41 in the subsequence 40, is an absolute point in time on a time scale t of the MRI system. Time value 42 may be a predetermined start time of the subsequence 40, defining the execution of the very first measurement block 41 of the subsequence 40.

By the connection of measurement blocks 41, 43 of the subsequence 40 via sequence timing requirements TR, an initial time value for the first measurement block is sufficient in order to correctly execute subsequence 40. This means that the execution of any set of subsequences 40 may be performed using only timing characteristics as selection criteria, without calculating additional loop structures based on structural criteria, and without calculating the necessity of fill times.

In FIG. 2, measurement blocks 41, 43 may be uninterruptible superblocks, and it can be seen that between the superblocks there are some gaps on the time axis that may be filled by other superblocks of other subsequences.

It is to be noted, that an arbitrary number and type of subsequences may be executed interleaved with the one subsequence 40 shown as long as they do not overlap. This is not achievable or not easily achievable with existing solutions such as the composite or tree structures.

Figure 3:
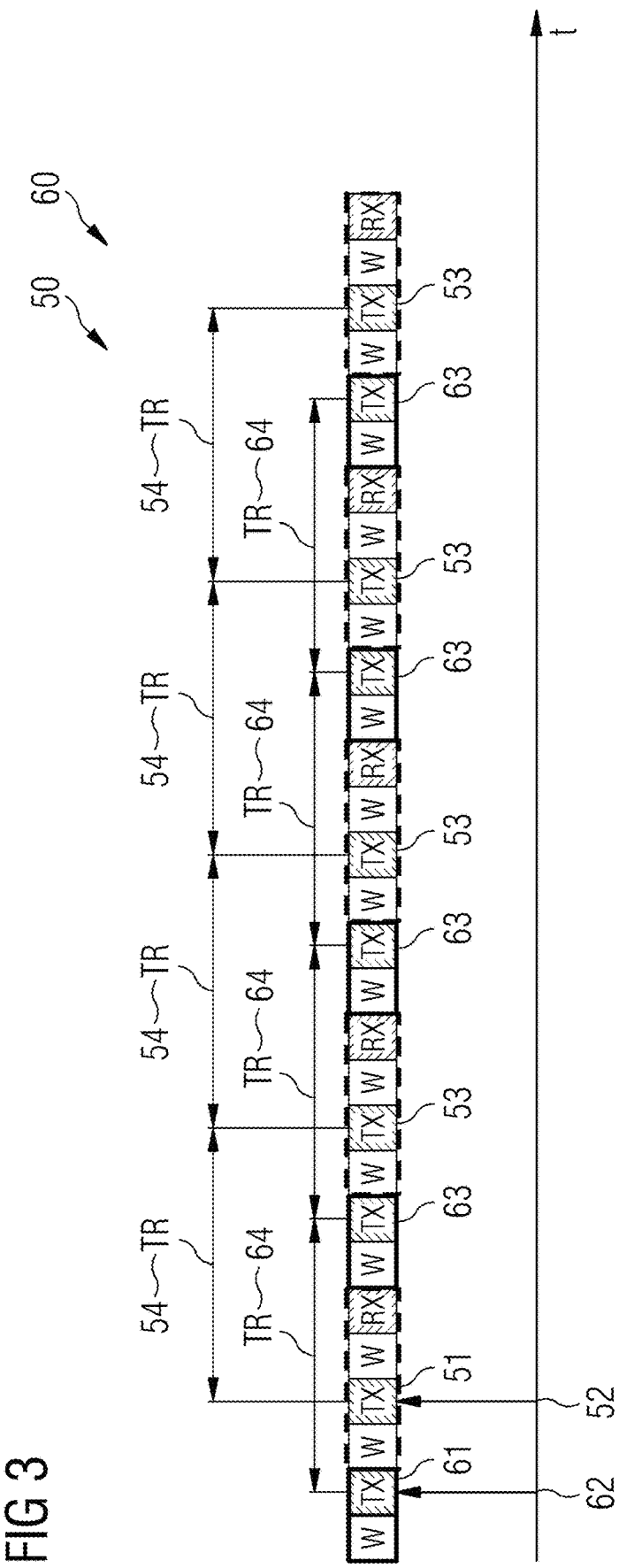

FIG. 3 schematically illustrates two interleaved measurement subsequences 50, 60, according to embodiments of the disclosure.

Measurement subsequence 50 is a GRE subsequence, and measurement subsequence 60 is an RSat subsequence in normal saturation mode.

As depicted in FIG. 3, the two measurement subsequences 50, 60 are comprised in a measurement sequence on the time scale t, wherein before each measurement block of the GRE subsequence a measurement block of the RSat subsequence is played out.

Measurement subsequence 50 comprises a next measurement block 51 and further following measurement blocks 53. The measurement blocks 51, 53 are connected via timing requirement 54 TR. The next measurement block 51 is associated with a time value 52, which defines an absolute point of time, when the next measurement block 51 is to be executed.

Measurement subsequence 60 comprises a next measurement block 61 and further following measurement blocks 63. The measurement blocks 61, 63 are connected via timing requirement 64. The next measurement block 61 is associated with a time value 62, which defines an absolute point of time, when the next measurement block 61 is to be executed.

In this example, the timing requirements 54 and 64, as well as time values 52 and 62 refer to the center of the first TX block in each measurement block.

As can be seen in FIG. 3, the next measurement block 51 of subsequence 50 and the next measurement block 60 one subsequence 60 are to be executed immediately after each other, as defined by time values 62 and 52.

As a consequence of the timing requirements 54 and 64, which in this example are TRs of the same length, also the following measurement blocks 63 and 53 are to be executed in pairs immediately following each other.

In the example of FIG. 3, execution of the subsequences 50, 60 by one or more embodiments according to the present disclosure results in pairs of following measurement blocks 63 and 53 in an uninterrupted sequence of measurement blocks in the resulting measurement sequence. No pausing blocks or empty time slices occur, as a consequence of initially predetermined starting times of subsequences 50, 60 (not depicted in FIG. 3) and timing requirements 64 and 54.

Figure 4:
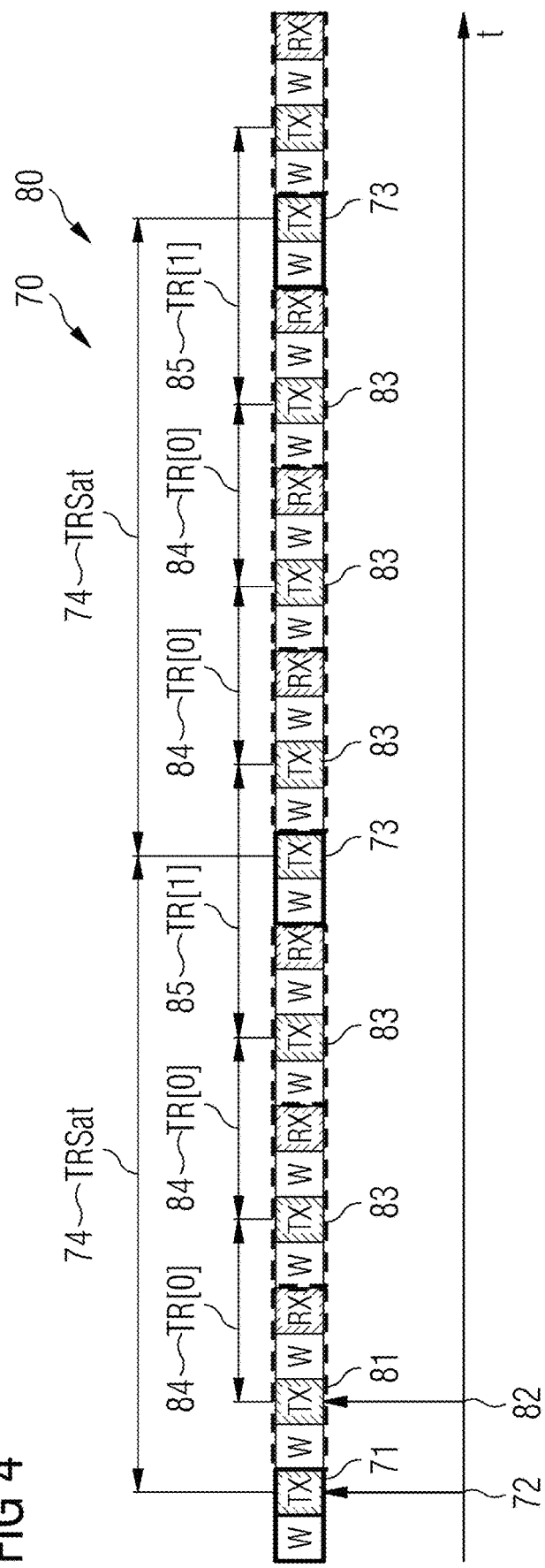

As will be shown in FIG. 4, a feature like "quick saturation" can be implemented by storing three instead of one TR in the protocol, i.e. by changing the TR of the RSat subsequence to a longer value, and defining different TR[1]s to each third GRE measurement block. Conventionally, a considerable amount of programming effort on the order of days to weeks has been necessary to add to existing code for a new special feature.

FIG. 4 schematically illustrates two further measurement sequence with interleaved subsequences, according to embodiments of the disclosure.

The two measurement subsequences 70, 80 correspond to measurement subsequences 50, 60 of FIG. 3, wherein the timing requirements 74, 84, 85 are chosen differently.

As can be seen in FIG. 4, each measurement subsequence 70, 80 has a next measurement block 71, 81, defined, which is associated with a respective time value 72, 82, and further comprises and following measurement blocks 73, 83.

In FIG. 4, subsequence 80 has two different timing requirements TR[0] (84) and TR[1] (85), which have different lengths. In measurement subsequence 80, two measurement blocks are associated with timing requirements TR[0] (84), and a third measurement block is associated with longer timing requirement TR[1] (85). In such a way, an interleaving pattern is effected, in which one measurement block by subsequence 70 is followed by three measurement blocks of subsequence 80, in a repetitive manner.

Figure 5:
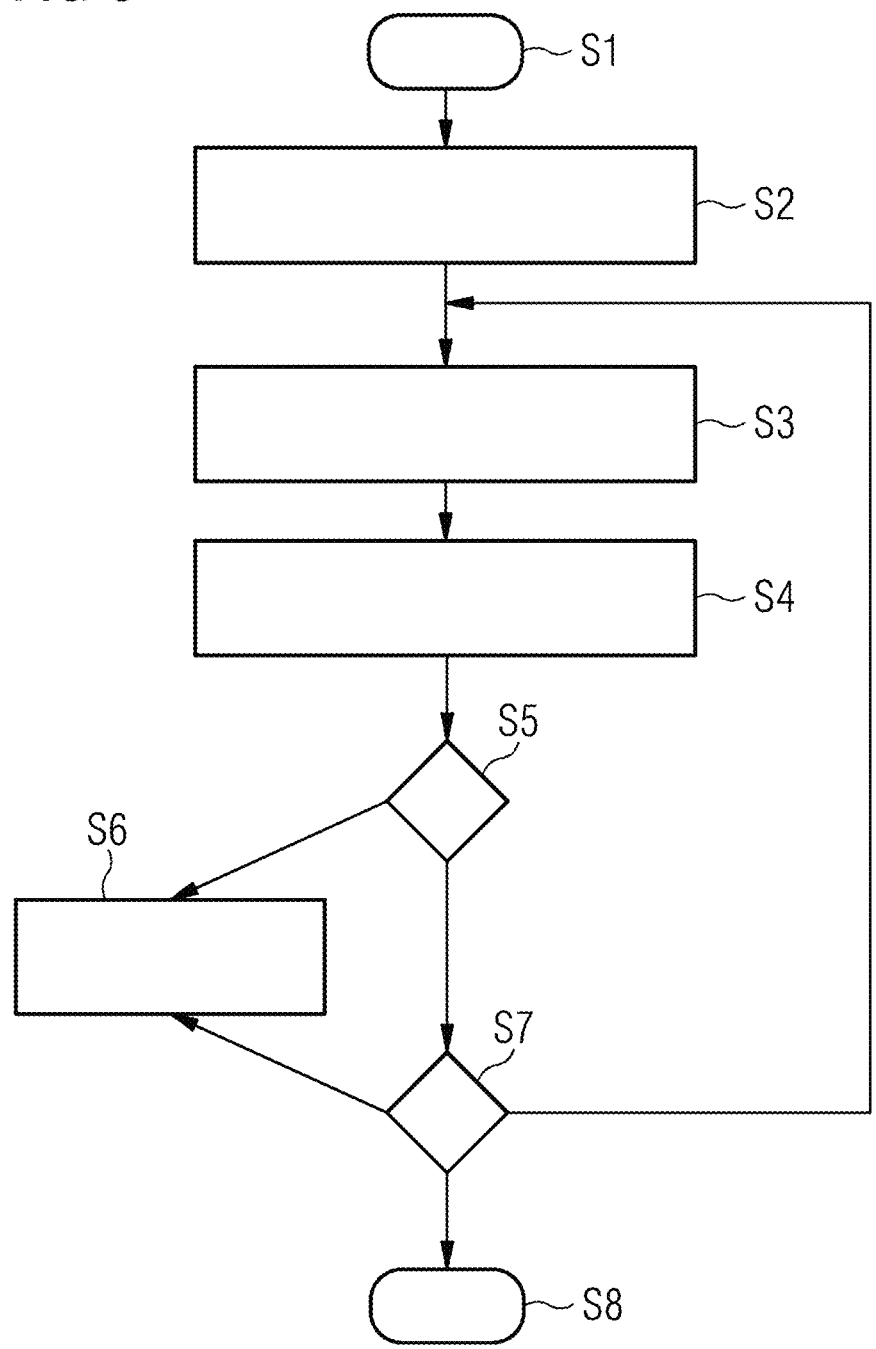

FIG. 5 schematically illustrates a flowchart with steps for executing measurement subsequences in an MRI system, according to embodiments of the disclosure.

A plurality of measurement subsequences are to be executed within a measurement sequence by the MRI system. Therein, the measurement subsequences comprise sequential measurement instructions to be executed by the MRI system wherein the measurement instructions are structured in sequential measurement blocks. Accordingly, for each measurement subsequence, a respective next measurement block is defined, which is the measurement block to be executed next of the sequential measurement blocks in the respective measurement subsequence. Each next measurement block is associated with a respective time value, which defines when the next measurement block is to be executed on a time scale by the MRI system. In an initial repetition of the steps of the method, a starting time may be predetermined for the very first measurement block of each measurement subsequence.

In various examples, the number of measurement blocks in a subsequence, as well as the timing between consecutive blocks, may be dynamic, i.e. determined at run time, wherein those run-time decisions avoid overlap of measurement blocks. For example, when a time value is to be determined for a measurement block, then the time value may be dynamically determined using a predetermined allowable time range for the measurement block in the subsequence. For example, when it is determined if another measurement block is to be executed in the subsequence, then it may be dynamically determined based on a minimum and maximum allowable number of measurement blocks in the subsequence.

The measurement subsequences are executed in a measurement sequence according to the following steps.

In various examples, MRI techniques, such as ECG-Triggering, respiratory gating, or any suitable dynamic waiting, may be considered by increasing all started time measurements and thus dynamically shifting all next measurement blocks of all subsequence into the future by a constant, and/or predetermined, amount of time. In various examples, such as for example hardware based ECG-triggering, this is done by "stopping the time" of the sequence execution.

In various embodiments, during execution of a set of subsequences, one or more further subsequences, i.e. subsequences not present when the measurement sequences has been started and is executed, may be added dynamically (i.e. during subsequence execution), wherein their global start time is in the future from the current point in time on the machine time scale and the non-overlapping condition is met.

For example, these further new subsequences may be simply inserted into the subsequence map, i.e. the software container from which they may be selected and extracted at the appropriate time, based on their starting time of the first measurement block, for execution. In various examples, subsequences may be dynamically removed and/or exchanged from the measurement sequence by removing and/or exchanging them in the software container, at run-time of the measurement sequence. Accordingly, the methods according to the present disclosure may further comprise inserting a further measurement subsequence into the subsequence map, during execution of the measurement subsequence.

The measurement sequence starts in step S1. In step S2, a subsequence map is initialized. The subsequence map comprises the measurement subsequences, wherein the measurement subsequences are sorted or ordered within the subsequence map according to the time values of their next respective measurement blocks.

In step S3, the first subsequence in the subsequence order in the subsequence map is taken out of the subsequence map.

In other words, from the subsequence map, the first measurement subsequence in the order is extracted. Where the subsequences are ordered in a temporal sequential order according to their time values, the first subsequence may correspond to the subsequence with the earliest, or soonest, time value. This time value of the first subsequence map may correspond to an absolute point in time which may lie in the future from the point of time when the first subsequence is extracted from the subsequence map.

In step S4, a measurement block of the first measurement subsequence is executed by the MRI system. Therein, the executed measurement block is the measurement block of the extracted measurement subsequence which is to be executed next in a sequential order of the measurement blocks, as defined in the subsequence, wherein other measurement blocks may already have been executed and/or may not be required to be executed in the following. In other words, for each extracted measurement subsequence, only one measurement block is executed, before the method proceeds to the next step S5.

In step S5, it is decided if the subsequence has to send another measurement block. In other words, it is determined if the extracted measurement subsequence comprises at least one further measurement block to be executed.

If it is determined that the extracted subsequence has to send another measurement block, in step S6, the extracted subsequence is inserted back into the subsequence map.

As a general principle, before inserting the first subsequence back into the subsequence map (sorted container), the global time of the execution of the next measurement block is requested from the subsequence. Then, the subsequences is put back into the map using the updated global time of the execution of the next measurement block. Thus, the complex task of determining the order of measurement blocks is reduced to an insert operation into the subsequence map.

Further, for reordering/sorting the subsequences within the subsequence map for the first subsequence, the determined further measurement block to be executed is characterized and identified for the first subsequence as a "next measurement block" associated with an absolute time value. This time value may be used to put the extracted measurement subsequence at a corresponding position in the order of subsequences, in the subsequence map.

For example, for the reinserting the extracted measurement subsequence, the measurement subsequence may be at an arbitrary position within the subsequence order, such that e.g. another one of the measurement subsequences in the subsequence map may be first in the order. It is to be understood that, provided that the time value of the reinserted measurement subsequence is the lowest, i.e. soonest, value of the subsequence or subsequences, the reinserted measurement subsequences may as well be at the first position in the subsequence order again.

In such a way, a new subsequence order may be defined in the subsequence map, wherein in order to perform the next measurement step in the overall measurement sequence, the new first measurement subsequence in the order has to be extracted and the first, i.e. the next measurement step of the extracted measurement subsequence has to be performed by the MRI system. In other words, within the subsequence map, or subsequences that are stored, which are not fully executed, wherein they have at least one further unexecuted measurement block.

If, in step S5, it is determined that the extracted measurement subsequence has no other measurement block to be performed, it may be assumed that the extracted measurement subsequence is fully executed; accordingly, it is defined that there is no next measurement step in the fully executed subsequence, and the subsequence is not reinserted into the subsequence map.

In step S7, it is determined if there is at least one further subsequence in the subsequence map.

If it is determined that there is a further subsequence in the subsequence map, the method proceeds to step S3, wherein the first subsequence in the subsequence map is extracted so that a further measurement block may be executed.

If it is determined, in step S7 that the subsequence map does not comprise a subsequence, then the method, i.e. the measurement sequence, ends in step S8.

According to the embodiments of the present disclosure, if the subsequence implementation follows a certain implementation strategy (defined by a software interface), then all subsequences can be rolled out with a simple while loop. Repetition of steps S3 to S7 may be iterated in a while loop, while there is at least one subsequence in the subsequence map.

The subsequences may be stored in sorted an associative container that stores subsequences sorted by the time at which the next X-Block center needs to be executed. The initial value for this time may be referred to as global "Subsequence Start Time".

It is to be noted that such a simple while loop makes modules consisting of thousands of lines of code obsolete while allowing the maximum flexibility for interleaving subsequences, and supports all use cases.

As an example, each measurement block in the embodiments according to the present disclosure may be an uninterruptible measurement block, i.e. a superblock.

Figure 6:
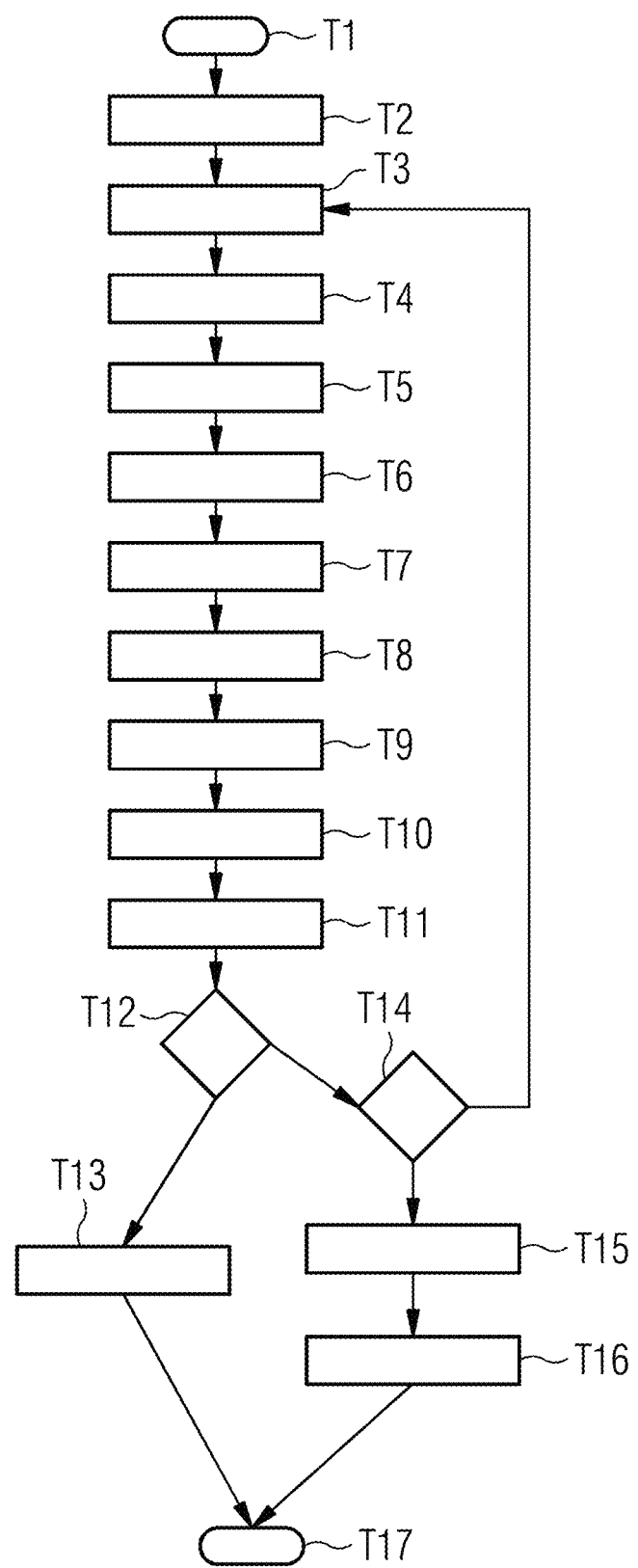
FIG. 6 illustrates a flowchart with steps for executing a measurement block of a MRI measurement subsequence, according to one or more embodiments of the disclosure.

FIG. 6 illustrates a flowchart with steps for executing a measurement block of a measurement subsequence, according to embodiments of the disclosure.

In various examples, the subsequence may also be programmed differently. For example, multiple implementation types of subsequences may be mixed as long as they "cooperate" with the process in FIG. 5, i.e. if they can provide the start time of the next measurement block, determine if there is another measurement block, and execute the measurement block when requested.

In the following, execution of a measurement block is described in more detail. In this example, a measurement block corresponds to a superblock comprising a number of WX blocks. However, it is to be understood that the following techniques may be applied to any measurement block consisting one or an arbitrary combination of an X block, W block, and WX block.

In step T1, the executing the measurement block starts. In step T2, the next WX block to be executed is searched, i.e. identified. In step T3, the subsequence indices are reordered. In step T4, the end time of the last time slice, which is the time slice last executed by the MRI system, is requested and/or received. In step T5, from the end time of the last time slice, the time to the next X block center is computed. In step T6, the next W block and X block are configured. In step T7, the duration of the W block is computed. In step T8, the start amplitude and end amplitude of the X block are requested and/or received. In step T9, the X interval is "snapped" to the hardware raster. In step T10, the W block is executed. In step T11, the X block is executed. In step T12, it is determined if the currents WX block has a successor WX block, i.e. if there is a following WX block, which is to be executed next.

If in step T12 it is determined that there is no successor, then, in step T13, the command "do not call again" is exported to the caller. Then, the method ends in step T17.

If a successor is determined, then in step T14 it is further determined if there is a break before the successor. A break may refer to the end of the current superblock.

If in step T14 it is determined that there is no break before the successor, then the method goes back to step T3, and the steps are repeated from there with the following WX block in the current superblock.

If in step T14 it is determined that there is a break before the successor, i.e. the current superblock is fully executed and there is following superblock to be executed in the subsequence, then in step T15 the following superblock is defined as the next superblock of the measurement subsequence, and the time of the center of the first X block in the next superblock is determined. The time value may be associated with the next superblock.

In step T16, the command "call again" and the time value of the center of the first X block in the next superblock is exported to the caller. According to an embodiment of the disclosure, the exported time value may be associated with the next superblock in the respective measurement subsequence.

Accordingly, when the command "call again" and the time of the center of the first X block is exported to the caller, it is determined that there is a another, i.e. following, the measurement block in the measurement subsequence to be executed next in the measurement subsequence, which is defined as the next superblock of the measurement subsequence, and the exported time is the time value, which is associated with the next superblock. Then, the method ends in step T17.

It is clear that the techniques described for executing a superblock may as well be applied for executing a normal measurement block.

The various embodiments according to the present disclosure may be based on the following findings:

A loop over the measurement blocks, which may be advantageously uninterruptible superblocks, of a measurement subsequence and their timing relations may be bundled together with the subsequence and rolled out based on selecting one measurement subsequence, and thereby one measurement block at a time.

This is in contrast to conventionally treating measurement blocks as independent elements, i.e. selecting the independent blocks in loops by structural features such as slice/layer, k-space line, and kernel pattern characteristics associated with the measurement blocks, and then trying to roll them out on the time axis.

The interleaving of those subsequence loops may be modeled as an extremely simple while loop allowing an arbitrary interleaving as long as the measurement blocks do not overlap on the time axis.

The interleaving pattern may only be defined by the global start time of each subsequence.

It is to be noted that computation or optimization of the global start times, as well as the timing requirements, may be performed within or separately from the method according to the present disclosure. The disclosed techniques provide a simple execution strategy. For most patterns, the computation of start times is rather trivial, as known optimizer-based methods may be used for arbitrary interleaving.

Figure 7:
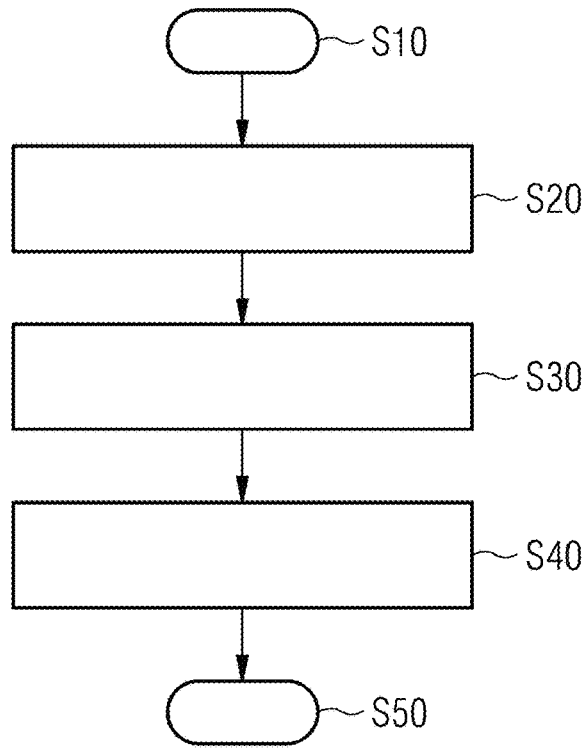
FIG. 7 illustrates a flowchart with steps for executing a MRI measurement sequence, according to one or more embodiments of the disclosure.

FIG. 7 illustrates a flowchart with steps for executing a measurement sequence, according to embodiments of the disclosure.

Within a measurement sequence, a plurality of measurement subsequences are to be executed by an MRI system. Each measurement subsequence comprises one or more measurement blocks, which include measurement instructions, specifically measurement instructions structured into a plurality of W, X, or WX blocks, to be executed by the MRI system in time slices on a measurement time scale. In a measurement subsequence a plurality of measurement blocks are included, which are to be executed in an order or predefined succession, as defined in the respective measurement subsequence. Therein, as defined one of the plurality of measurement blocks in the measurement subsequence is the measurement block to be executed next in the measurement subsequence, i.e. defined as next measurement block. This next measurement block is identified with a respective time value, which may be an absolute point in time, when the next measurement block is to be executed on the machine time scale. Such, that definition of the next measurement block together with the time value can be used as unambiguous instruction for the MRI system to execute the next measurement block of the measurement subsequence when the measurement subsequence is selected.

The method starts in step S10. In step S20, the measurement subsequences, which have a next measurement block defined, are stored in a subsequence map, wherein each subsequence, including all its respective measurement blocks, is treated as an individual element, and the subsequences are ordered within the subsequence map according to the time values of their next measurement blocks.

In step S30, from the subsequence map, the first measurement subsequence in the order is extracted. In step S40, of the first measurement subsequence, which is extracted from the subsequence map, the next measurement block is executed by the MRI system. The method ends in step S50.

As a general principle, from a list or group of measurement subsequences, each measurement subsequence is characterized by a time value of its next measurement block, which is used to identify a measurement subsequence for which the MRI system is to execute the next measurement block.

Figure 8:
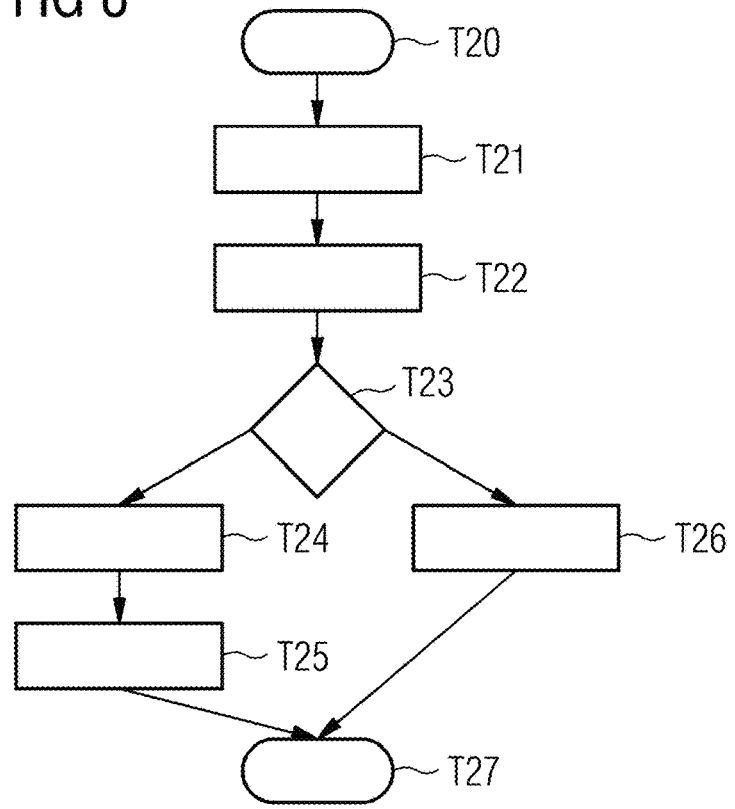
FIG. 8 illustrates a flowchart with steps for executing a measurement block by a MRI measurement subsequence, according to one or more embodiments of the disclosure.

FIG. 8 illustrates another flowchart with steps for executing a measurement block by a measurement subsequence, according to embodiments of the disclosure.

The method starts in step T20. In step T21, the measurement block starts. In step T22, the measurement block is executed at the global time defined by the time value associated with measurement block. In step T23, it is determined if the subsequence comprises a successor measurement block. If yes, then in step T24 a time value is determined for the successor measurement block, which is an absolute time value when the successor measurement block is to be executed on the global machine time scale of the MRI system, and in step T25, the measurement sequence exports "call again" and the determined time value. If it is determined that the measurement subsequence does not comprise a next successor measurement block, then in step T26 the measurement subsequence exports do not call again. The method ends in step T27.

From the above it can be seen that by storing and extracting subsequences in a subsequences in a software container, wherein the subsequences are characterized only by the time value of their respective next measurement blocks, the measurement blocks may be elegantly interleaved on a time scale of the MRI system in an overall measurement sequence.

It will be understood that the described techniques may be applied to execute any or any combination of interleaved and non-interleaved subsequences. Thereby, subsequences in a complex interdependency with each other and/or with measurement system boundary conditions may be executed without prior computation effort for defining an interleaving pattern.

From the above, some general conclusions may be drawn:

A method may be a computer-implemented method, which may be automatically performed by a measurement system without human assistance or control.

The principles of the disclosure have been described with regard to an MRI system, an MRI measurement sequence, and MRI measurement subsequences; however, a person skilled in the art will understand that the above principles may also be applied to a magnetic resonance (MR) measurement system or a general measurement system, which may be designed to execute a number of independent physical examinations defined in measurement subsequences comprising measurement blocks, which may be executed in an interleaved manner by the measurement system. In this regard, the abbreviations MRI and MR may be replaced, exchanged, or omitted in order to describe the respective features in the respective technical system. It is to be appreciated that in the foregoing description, in expressions, such as measurement sequence, measurement subsequence, and similar, the word measurement is omitted for reasons of conciseness.

The disclosed techniques may be used for generating, and/or optimizing, and/or executing a measurement sequence. For example, a measurement block may be stored in a sequence model instead of immediately executing the measurement block, such that initial time values, and/or timing requirements, and/or global restrictions of the MRI system may be varied in order to optimize the in such a way generated measurement sequence, in particular minimizing the measurement time of an interleaved measurement sequence. In an embodiment, only the subsequences and respective start times for each subsequence may be provided as input based on which a complete measurement sequence may be executed by an MRI system with the subsequences interleaved.

As a further step, the method may comprise obtaining a plurality of measurement sequences to be executed in the measurement sequence by the MR system.

Measurement sequences and subsequences may refer to a sequence of measurement blocks to be executed by a measurement system. In other words, a measurement subsequence may comprise measurement blocks in a similar way as a measurement sequence, i.e. the measurement blocks of a measurement subsequence may be executed within a measurement sequence.

A measurement sequence may be referred to as an interleaved measurement sequence if it comprises a plurality of subsequences, wherein at least two of the plurality of measurement blocks of different measurement subsequences are interleaved with each other in time, i.e. on a time scale of the measurement system.

Summarizing, a method for executing a measurement sequence is provided for executing the measurement blocks of subsequences. The subsequences are implemented as separate elements or containers, which each subsequence includes all its respective measurements blocks. Therein, each subsequence may be characterized for selection only by time value, describing the execution time for its next measurement block. The subsequences may be inserted into and extracted from a sorted associative container, and in the sorted associative container they may be ordered as separate data storage elements including all their measurement blocks, only based on their respective time value. In such a way, measurement blocks may be selected for execution from any subsequence, wherein an interleaving pattern is created at run-time without taking into account other characterizing features of a measurement block.

In various examples, in a method for interleaved execution of MRI measurement subsequences, each MRI measurement subsequence is characterized by an absolute time value on a global MRI system time scale, which defines the starting time of the next measurement block to be executed for the MRI subsequence by the MRI system. The MRI measurement subsequences are stored in a software container, wherein they are ordered according to their respective time values. For interleaved execution of the MRI measurement sequences, in run-time for each executed measurement block, the first measurement subsequence in the order is extracted from the container for execution of the respective next measurement block, then after execution of the measurement block, the MRI measurement subsequence is stored back into the container with an updated time value, wherein the updated time value defines a start time of a following measurement block of the MRI measurement subsequence, if the MRI subsequence has another measurement block to be executed.

Thereby, programming effort for executing MRI measurement sequences is significantly reduced wherein arbitrary measurement subsequences may be assembled and executed without prior defining of an interleaving pattern, and new, e.g. irregular or changing, interleaving patterns are made possible, which may lead to reduced measurement times.

Although the disclosure has been shown and described with respect to certain preferred embodiments, equivalents and modifications will occur to those skilled in the art upon the reading and understanding of the specification. The present disclosure includes all such equivalents and modifications and is limited only by the scope of the appended claims.

What is claimed is:

1. A method for executing a measurement sequence in a magnetic resonance imaging (MRI) system, comprising:

storing, via the MRI system, a plurality of measurement subsequences to be executed within the measurement sequence in a container stored in a memory, each one of the plurality of measurement subsequences (i) being executable independently of other ones of the plurality of measurement subsequences, (ii) comprising measurement blocks including measurement instructions to be executed by the MRI system, and (iii) comprising a respective time value that defines when a next measurement block within a respective one of the plurality of measurement subsequences is to be executed within a global time scale by the MRI system, the global time scale defining a time period used by the MRI system to execute the measurement sequence, wherein the plurality of measurement subsequences are stored in an ordered manner as separate elements in a subsequence order according to their respective time values, and wherein the time values are uniquely identified for each one of the plurality of measurement subsequences and are indicative of a respective point in time on the global time scale;

determining an order of execution of measurement blocks associated with a first measurement subsequence from among the plurality of measurement subsequences by iteratively:

accessing, via the MRI system from the memory, the first measurement subsequence in the subsequence order;

selectively updating, via the MRI system, the time value for the first measurement subsequence based upon (i) a time value of a previous measurement block of the first measurement subsequence that is to be executed, and (ii) timing requirements of the measurement sequence;

selectively updating, via the MRI system, the container using the updated time value as the respective time value for the first measurement subsequence such that the accessed first measurement subsequence is positioned in the subsequence order stored in the memory according to the updated time value; and executing, via the MRI system, each measurement block in accordance with the accessed first measurement subsequence based upon the respective time value of each measurement block to be executed as stored in the container upon accessing the first measurement subsequence.

2. The method according to claim 1, wherein the selectively updating the respective time value for the first measurement subsequence and the selectively updating the container using the updated time value as the respective time value is based upon determining, via the MRI system, whether the accessed first measurement subsequence comprises a subsequent measurement block that is to be executed next in the accessed first measurement subsequence.

3. The method according to claim 1, wherein:
accessing the first measurement subsequence comprises removing the first measurement subsequence from the container; and
selectively updating the container using the updated time value comprises inserting the accessed first measurement subsequence into the container with the updated time value.

4. The method according to claim 3, wherein when the accessed first measurement subsequence does not comprise a subsequent measurement block, the accessed first measurement subsequence is not inserted back into the container.

5. The method according to claim 1, wherein the subsequence order is a linear and/or ascending order of the plurality of measurement subsequences according to respective time values.

6. The method according to claim 1, wherein the plurality of measurement subsequences are stored as individual elements in the container.

7. The method according to claim 1, wherein the container stored in the memory is a sorted associative container into which the plurality of measurement subsequences are sorted using respective time values as a sorting key.

8. The method according to claim 3, further comprising:
repeatedly accessing each one of the plurality of measurement subsequences and removing each one of the plurality of measurement subsequences from the container until the container is empty.

9. The method according to claim 1, wherein in an initial repetition the time value of the first measurement subsequence is a predetermined time for the first measurement subsequence, and for subsequent repetitions time values for respectively-executed subsequent measurement subsequences are determined at run-time.

10. The method according to claim 1, wherein the measurement blocks are uninterruptible measurement blocks.

11. The method according to claim 1, wherein the time value is determined using global restrictions of the MRI system.

12. The method according to claim 1, wherein the plurality of measurement subsequences are stored in a non-interleaved manner and executed in an interleaved manner.

13. The method according to claim 1, further comprising:
repeating the (i) executing the next measurement block in accordance with the accessed first measurement subsequence, and (ii) updating the subsequence order, until all measurement blocks of all stored measurement subsequences have been executed.

14. The method according to claim 1, further comprising:
determining, via the MRI system, an execution order of the plurality of measurement subsequences in accordance with the subsequence order, which corresponds to a sequential order of execution according to the respective time values identified with each one of the plurality of measurement subsequences.

15. The method according to claim 1, wherein the first measurement subsequence is part of a subsequence map that comprises each of the plurality of measurement subsequences that are to be executed via the MRI system, and
wherein selectively updating the container comprises inserting the first measurement subsequence within the subsequence map at a position in the subsequence order according to the updated time value.

16. The method of claim 1, wherein the first measurement subsequence is part of a subsequence map that comprises each of the plurality of measurement subsequences that are to be executed via the MRI system, and further comprising:
while at least one of the plurality of measurement subsequences remains within the subsequence map, iteratively repeating the acts of (i) executing each measurement block in accordance with the accessed first measurement subsequence, and (ii) updating the subsequence order, until all measurement blocks of all stored measurement subsequences have been executed.

17. A magnetic resonance imaging (MRI) system, comprising:
an MRI control circuitry; and
a memory unit configured to store control information executable by the MRI control circuitry that, when executed by the MRI control circuitry, cause the MRI system to:
store a plurality of measurement subsequences to be executed within the measurement sequence in a container stored in a memory, each one of the plurality of measurement subsequences (i) being executable independently of other ones of the plurality of measurement subsequences, (ii) comprising measurement blocks including measurement instructions to be executed by the MRI system, and (iii) including a respective time value that defines when a next measurement block within a respective one of the plurality of measurement subsequences is to be executed within a global time scale by the MRI system, the global time scale defining a time period used by the MRI system to execute the measurement sequence,
wherein the plurality of measurement subsequences are stored in an ordered manner as separate elements in a subsequence order according to their respective time values, and
wherein the time values are uniquely identified for each one of the plurality of measurement subsequences and are indicative of a respective point in time on the global time scale;
determining an order of execution of measurement blocks associated with a first measurement subsequence from among the plurality of measurement subsequences by iteratively:
accessing, from the memory, the first measurement in the subsequence order;
selectively updating, via the MRI system, the time value for the first measurement subsequence based upon (i) a time value of a previous measurement block of the first measurement subsequence that is to be executed, and (in) timing requirements of the measurement sequence;
selectively updating, via the MRI system, the container using the updated time value as the respective time value for the first measurement subsequence such that the accessed first measurement subsequence is positioned in the subsequence order stored in the memory according to the updated time value; and executing each measurement block in accordance with the accessed first measurement subsequence based upon the respective time value of each measurement block to be executed as stored in the container upon accessing the first measurement subsequence.

18. A non-transitory electronically readable data carrier comprising electronically-readable control information stored thereon that, when executed in a magnetic resonance imaging (MRI) control unit of an MRI system, causes the MRI system to:

store a plurality of measurement subsequences to be executed within the measurement sequence in a container stored in a memory, each one of the plurality of measurement subsequences (i) being executable independently of other ones of the plurality of measurement subsequences, (ii) comprising measurement blocks including measurement instructions to be executed by the MRI system, and (iii) including a respective time value that defines when a next measurement block within a respective one of the plurality of measurement subsequences is to be executed within a global time scale by the MRI system, the global time scale defining a time period used by the MRI system to execute the measurement sequence, wherein the plurality of measurement subsequences are stored in an ordered manner as separate elements in a subsequence order according to their respective time values, and wherein the time values are uniquely identified for each one of the plurality of measurement subsequences and are indicative of a respective point in time on the global time scale;

determining an order of execution of measurement blocks associated with a first measurement subsequence from among the plurality of measurement subsequences by iteratively:

accessing, from the memory, the first measurement subsequence in the subsequence order;

selectively updating, via the MRI system, the time value for the first measurement subsequence based upon (i) a time value of a previous measurement block of the first measurement subsequence that is to be executed, and (ii) timing requirements of the measurement sequence;

selectively updating, via the MRI system, the container using the updated time value as the respective time value for the first measurement subsequence such that the accessed first measurement subsequence is positioned in the subsequence order stored in the memory according to the updated time value; and executing each measurement block in accordance with the accessed first measurement subsequence based upon the respective time value of each measurement block to be executed as stored in the container upon accessing the first measurement subsequence.

* * * * *